United States Patent
Wu et al.

(10) Patent No.: US 7,154,149 B2
(45) Date of Patent: Dec. 26, 2006

(54) EDS PROTECTION CONFIGURATION AND METHOD FOR LIGHT EMITTING DIODES

(75) Inventors: Jen-Chau Wu, Hsin-Chu (TW); Cheng-Chung Yang, Chang-Hua Hsien (TW); Rong-Yih Hwang, Hsin-Chu Hsien (TW); Chuan-Cheng Tu, Taipei (TW)

(73) Assignee: Epistar Corporation, Hsinchu (TW)

( * ) Notice: Subject to any disclaimer, the term of this patent is extended or adjusted under 35 U.S.C. 154(b) by 66 days.

(21) Appl. No.: 10/791,709

(22) Filed: Mar. 4, 2004

(65) Prior Publication Data
US 2005/0023575 A1    Feb. 3, 2005

(30) Foreign Application Priority Data
Jul. 31, 2003   (TW) .............................. 92120977 A

(51) Int. Cl.
*H01L 23/62* (2006.01)
(52) U.S. Cl. ......................................... 257/355; 257/79
(58) Field of Classification Search ................ 257/79, 257/355
See application file for complete search history.

(56) References Cited

FOREIGN PATENT DOCUMENTS

| DE | 42 42 604 A1 | 6/1993 |
|---|---|---|
| DE | 695 08 639 T2 | 9/1999 |
| DE | 199 45 134 C 2 | 8/2003 |
| EP | 0 678 982 B1 | 3/1999 |
| FR | 2630869 | * 4/1988 |
| JP | 8-56034 | 2/1996 |
| JP | P2001-15817 A | 1/2001 |
| JP | P2001-93320 A | 4/2001 |

* cited by examiner

*Primary Examiner*—Long Pham
(74) *Attorney, Agent, or Firm*—Winston Hsu

(57) ABSTRACT

This invention relates to an ESD protection configuration and method for light emitting diodes (LED), including an LED an LED, having a p-n junction and connected to a circuit substrate, the circuit substrate having two p-type substrates and one n-type substrate therein; a first ESD protection configuration, built-in the circuit substrate and including a first resistor, a first capacitor and a first diode that are connected in series and then engage a parallel connection with the LED, wherein the first diode has a p-node connected to an n-node of the LED; and a second ESD protection configuration, built-in the circuit substrate and including a second resistor, a second capacitor and a second diode that are connected in series and then engage a parallel connection with the LED and the first ESD protection configuration, wherein the second diode has a p-node connected to the p-node of the LED, whereby such a configuration absorbs and removes ESD induced upon human contact and prevents the LED from burning to effectively extend the lifespan of the LED.

20 Claims, 5 Drawing Sheets

EDS PROTECTION CONFIGURATION AND METHOD FOR LIGHT EMITTING DIODES

CROSS-REFERENCE TO RELATED APPLICATIONS

Not Applicable

STATEMENT REGARDING FEDERALLY SPONSORED RESEARCH OR DEVELOPMENT

Not Applicable

DESCRIPTION

1. Field of Invention

This invention relates to an electrostatic discharge (ESD) protection configuration and method for light emitting diodes (LED), particularly to one intended for preventing the LED from burning so as to effectively extend the lifespan of LED by subjecting the LED to engage a parallel connection with an RC circuit or a first and a second ESD protection configuration for absorbing and removing spikes induced upon human contact with the LED.

2. Background

The flourishing developments of electronic industry allow increasing utilization of LED to manufacture alarming, animation or advertisement products, such as, traffic signals with animation effects and large-scale advertisement billboards composed of LED. The LED is featured with the advantages of enhanced brightness, extended lifespan and feasibility for manufacturing large-scale billboards such that they are widely implemented in various industries.

In view of the current trend of development, it is expected that the brightness of the next-generation LED will be significantly improved to serve as a highly efficient light source. In particular, power LED chips are featured with an overall dimension ten times greater than that of a conventional chip to allow extensive applications such that the power LED chips will be one of the prospective components. Power LED chips are commonly mounted onto a surmount substrate by adopting flip-chip structure to enhance illumination efficiency and thermal conductivity. Human contact is sometimes inevitable in the process of mounting the LED to a module thereby resulting in ESD that would damage the LED. In particular, in view of the currently available technology in material sciences, the new-generation high speed semiconductors, such as Groups III–V nitride semiconductors containing InGaN, consisting of an increasing dimension are accompanied by high defect concentration. ESD has thus become a major problem while employing such semiconductors in high temperature electronic components.

As disclosed in U.S. Pat. No. 5,914,501, a conventional approach for resolving the ESD problem is to subject an LED to engage a parallel connection with a set of back-to-back Zener diodes for modulating voltages entering the LED through the opposing terminals. A similar approach is to mount the Zener diodes in a silicon surmount substrate. However, unexpected spikes may still burn the LED due to the delayed response time and the parasitic inductance of the Zener diodes.

SUMMARY OF INVENTION

To resolve the shortcomings of the conventional art, the objective of this invention is to provide an ESD protection configuration and method for LED, that prevents the LED from burning and effectively extends the lifespan of LED by subjecting the LED to engage a parallel connection with an RC circuit for absorbing and removing spikes induced upon human contact with the LED.

To achieve the above objective, this invention discloses an ESD protection configuration and method for LED: comprising: an LED having a p-n junction, a resistor having a first end connected to an n-node of the LED, a capacitor having a first end connected to a second end of the resistor and a second end connected to a p-node of the LED, whereby the RC circuit that is in a parallel connection with the LED serves as an ESD projection configuration that prevents the LED from burning and effectively extends the lifespan of LED.

To achieve the above objective, this invention discloses an alternative ESD protection configuration for LED, comprising: an LED having a p-n junction and connected to a circuit substrate, the circuit substrate having therein two p-type substrates and one n-type substrate; a first ESD protection configuration built-in the circuit substrate and including a first capacitor, a first resistor and a first diode that are connected in series and then engage a parallel connection with the LED, wherein the first diode has a p-node connected to an n-node of the LED; a second ESD protection configuration built-in the circuit substrate and including a second capacitor, a second resistor and a second diode that are connected in series and then engage a parallel connection with the LED and first ESD protection configuration, wherein the second diode has a p-node connected to the p-node of the LED.

These and other modifications and advantages will become even more apparent from the following detained description of a preferred embodiment of the invention and from the drawings in which:

DETAILED DESCRIPTION OF THE INVENTION (PREFERRED EMBODIMENTS)

The LED referred in this invention covers conventional LED and other illuminating LED, such as Laser diodes. The details of this invention are now explained by referring to the accompanying drawings.

[First Embodiment]

Figure 1:
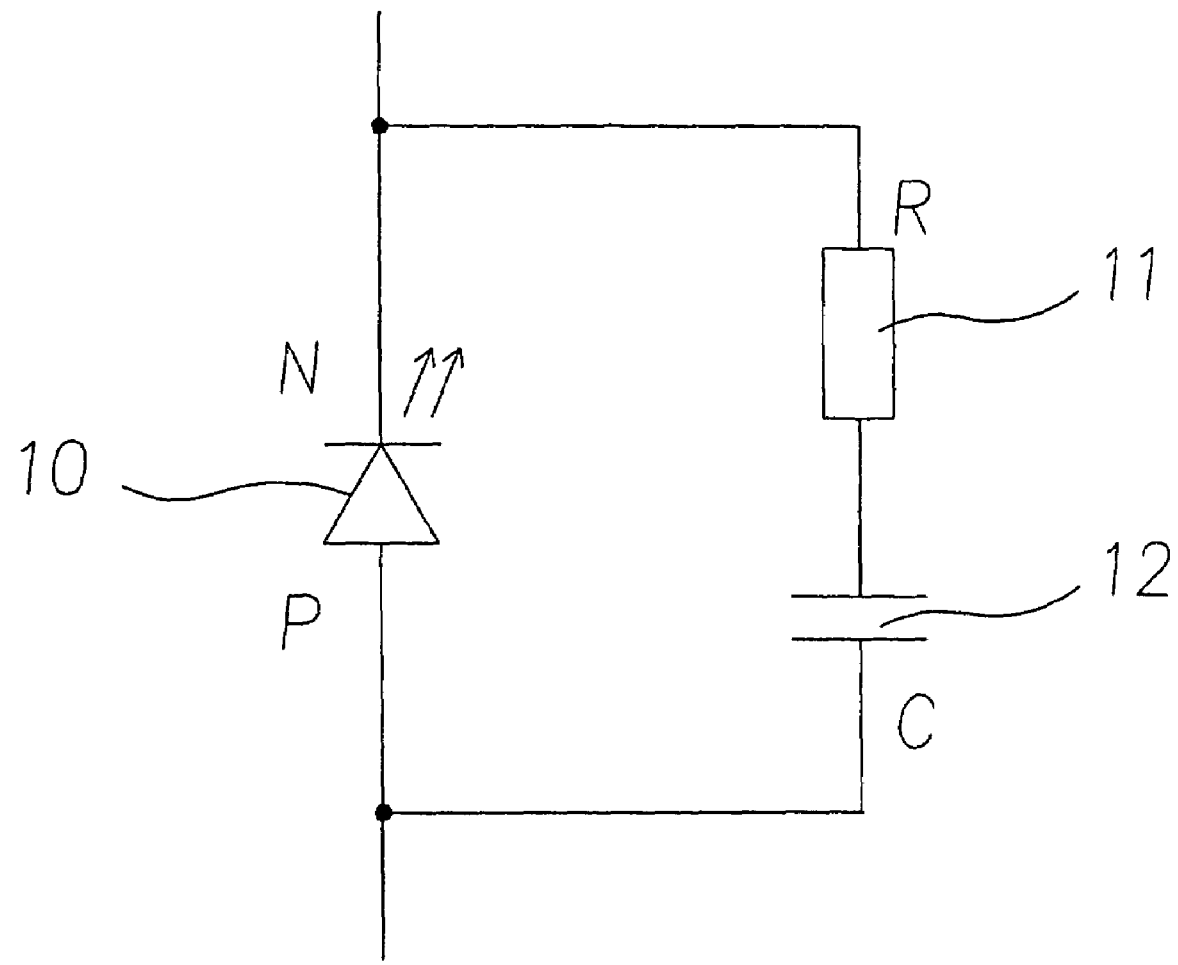
FIG. 1 is a circuit diagram showing an LED engaging a parallel connection with an RC circuit according to this invention.

FIG. 1 is a circuit diagram showing an LED engaging a parallel connection with an RC circuit according to this invention, wherein a resistor 11 and a capacitor 12 in a series connection engages a parallel connection with an LED 10. The LED 10 is a high speed semiconductor, such as Groups III–V nitride semiconductors containing InGaN, which would easily induce ESD upon human contact thereby causing damages. The parallel connection of the LED with the circuit consisting of the resistor 11 and capacitor 12 connected in series guards the LED against damages. The laminar structure of the LED is illustrated in FIGS. 2 and 3 in details.

Figure 2:
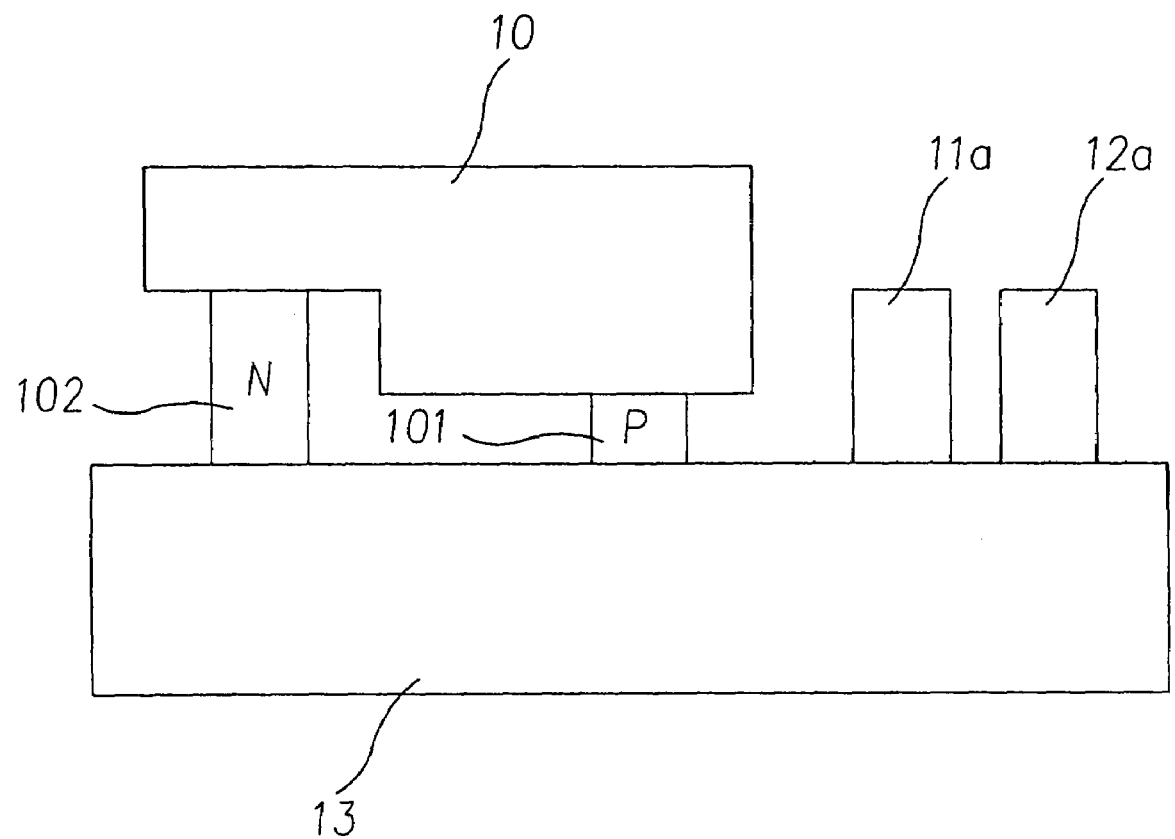
FIG. 2 is a schematic drawing illustrating the laminar structure of an LED in a parallel connection with an RC circuit according to a first embodiment of this invention.

FIG. 2 is a schematic drawing illustrating the laminar structure of the LED in a parallel connection with the RC circuit according to an embodiment of this invention, wherein a resistor 11a and a capacitor 12a are situated outside a circuit substrate 13 and connected to a p-node 101 and an n-node 102 of the LED 10 via the circuit substrate 13 to construct a structure with an RC circuit externally connected to the LED.

Figure 3:
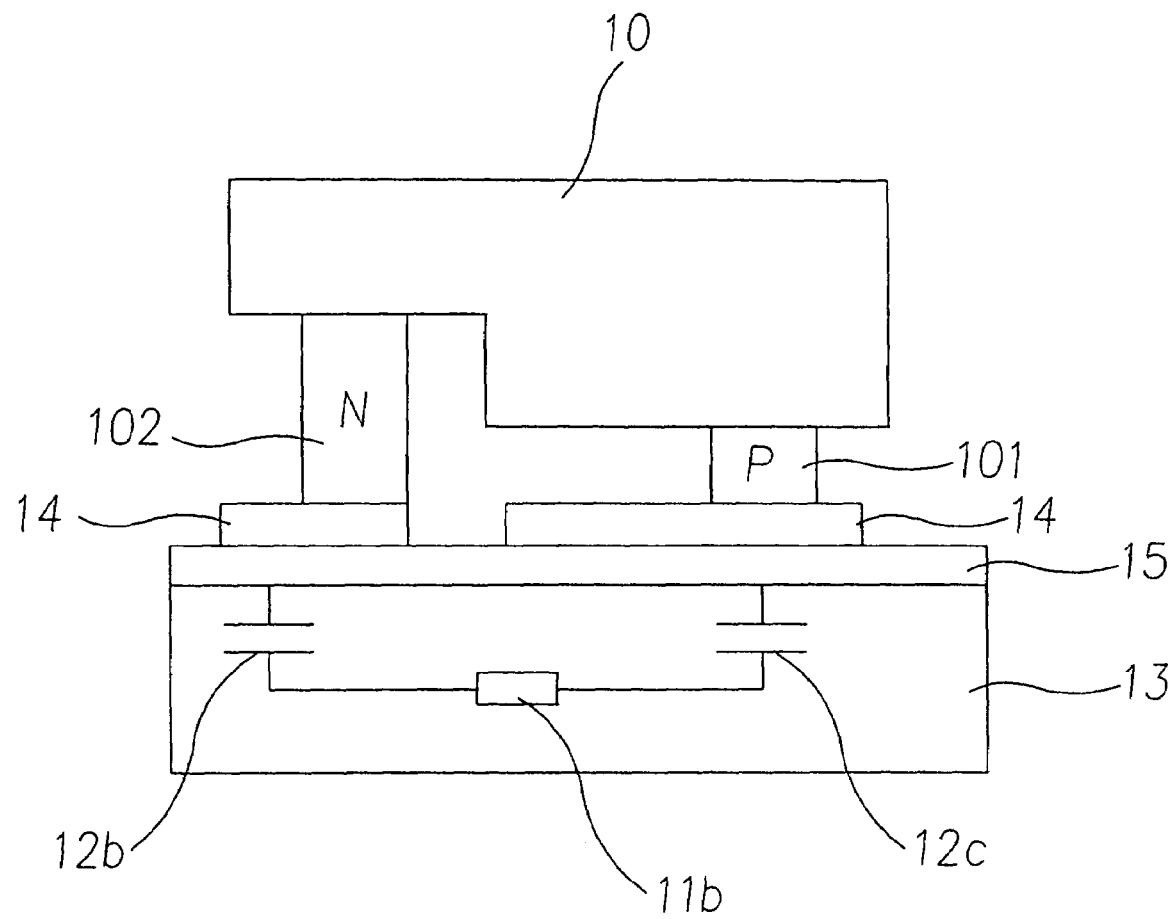
FIG. 3 is a schematic drawing illustrating the laminar structure of an LED in a parallel connection with an RC circuit according to a second embodiment of this invention.

FIG. 3 is a schematic drawing illustrating the laminar structure of the LED in a parallel connection with the RC circuit according to a second embodiment of this invention, wherein a resistor 11b, a first capacitor 12b and a second capacitor 12c are situated inside a circuit substrate 13. The resistor 11b is disposed between the first capacitor 12b and the second capacitor 12c. An ideal resistance for the resistor 11b is 1KΩ. The two capacitors are made of a material having a high dielectric constant greater than 3.9, such as $SiN_x$, $SiO_2$, $TiO_2$, TiN and $BaTiO_3$, or their series material, and connected to an LED 10 via a p-node and an n-node of the circuit substrate 13. To ensure that a precise and useful capacitance may be reached, the first capacitor 12b and second capacitor 12c connected in series are treated to have an equivalent capacitance represented by the following formula:

$$1/C = 1/C_1 + 1/C_2.$$

A metal conductive layer 14 and an insulator 15 are disposed between the p-n junction of the LED 10 and the circuit substrate 13 to ensure normal operation of the projection configuration connected to the LED 10 without any open or short circuits.

The structures disclosed in FIGS. 1, 2 and 3 may prevent accumulation of ESC to the LED 10 upon human contact. However, enhanced structures are found and disclosed in FIGS. 4 and 5 according to this invention.

[Second Embodiment]

Figure 4:
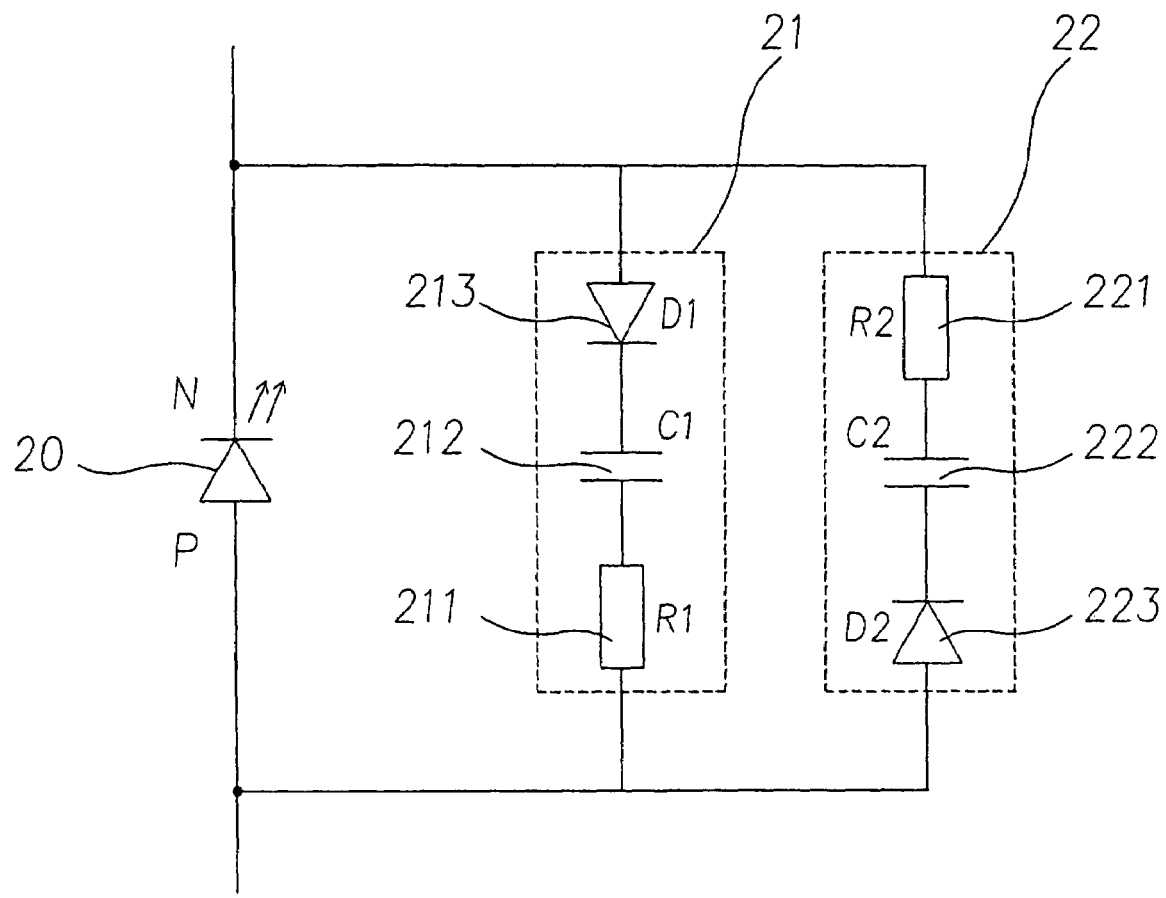
FIG. 4 is a circuit diagram showing an LED engaging a parallel connection with components of a first and a second ESD protection configuration according to this invention.
Figure 5:
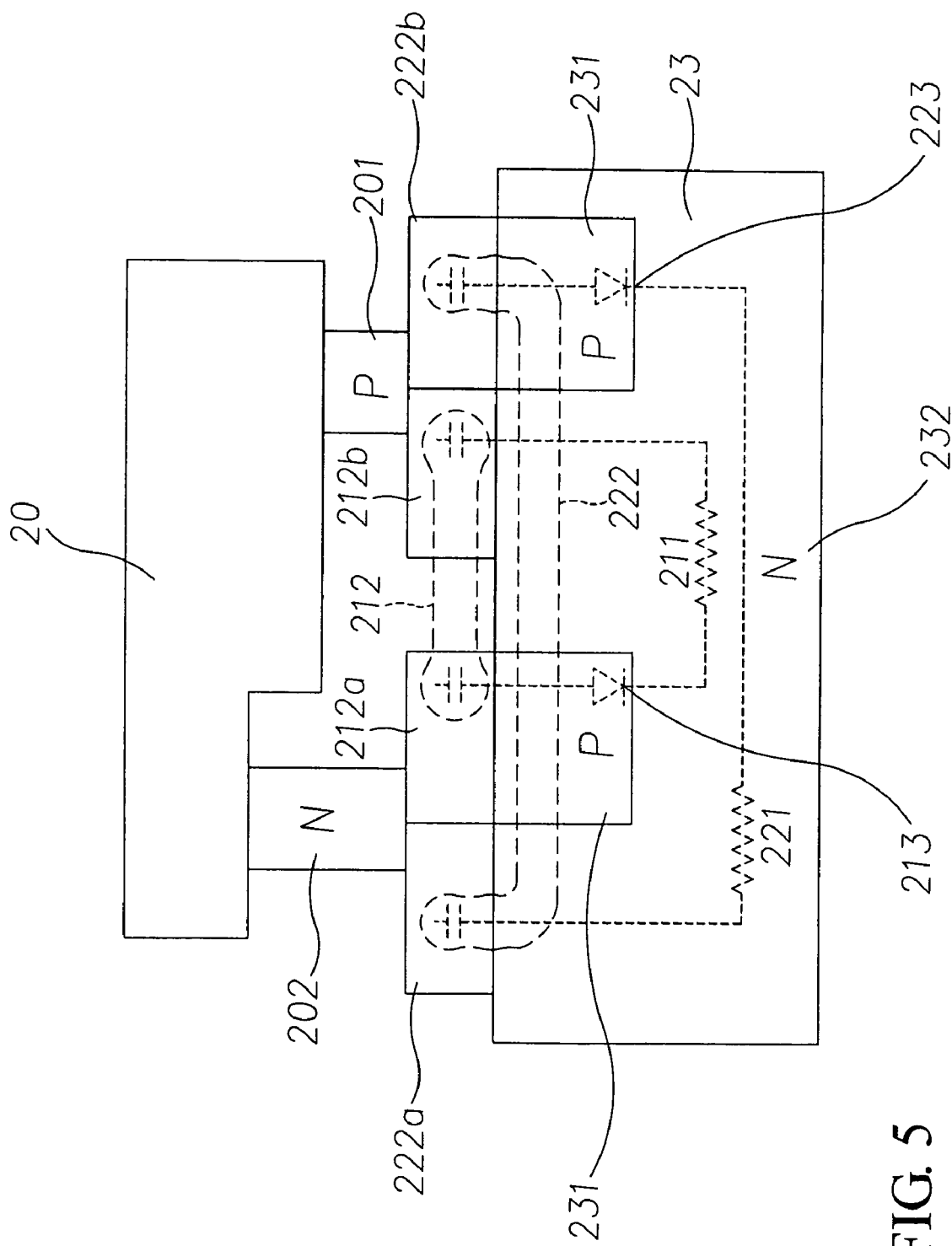
FIG. 5 is a schematic drawing illustrating the laminar structure of an LED in a parallel connection with a first and a second ESD protection configuration according to this invention.

FIGS. 4 and 5, respectively, illustrate a circuit diagram and a schematic drawing illustrating the laminar structure of an LED engaging a parallel connection with components of a first and a second ESD protection configuration according to this invention, comprising: an LED 20 having a junction formed by a p-node 201 and an n-node 202 and connected to a circuit substrate 23, the circuit substrate 23 having therein two p-type substrates 231 and one n-type substrate 232; a first ESD protection configuration 21 built-in the circuit substrate 23; and a second ESD protection configuration 22 built-in the circuit substrate 23.

The first ESD protection configuration 21 includes a first resistor 211, a third capacitor 212, and a first diode 213 that are connected in series and then engage a parallel connection with the LED 20. The first diode 213 has a p-node connected to the n-node 202 of the LED 20. The third capacitor 213 consists of a fifth capacitor 212a and a sixth capacitor 212b connected in series. An equivalent capacitance of the third capacitor 212 may be represented by the formula, $$1C_{212} = 1/C_{212a} + 1/C_{212b};$$

The second ESD protection configuration 22 includes a second resistor 221, a fourth capacitor 222 and a second diode 223 that are connected in series and then engage a parallel connection with the LED 20 and the first ESD protection configuration 21. The second diode 223 has a p-node connected to the p-node 201 of the LED 20. The fourth capacitor 222 consists of a seventh capacitor 222a and an eight capacitor 222b connected in series. An equivalent capacitance of the fourth capacitor 222 may be represented by the formula, $$1/C_{222} = 1/C_{222a} + 1/C_{222b}.$$

In the above construction, the third capacitance 212 is greater than the fourth capacitance 222, where both capacitance ranges between 100 pF and 100 nF. Such an arrangement of capacitance prevents from inducing ESD spikes of a larger magnitude upon forward bias of the LED 20, while the fourth capacitor 22 with a smaller capacitance serves to absorb ESD spikes of a smaller magnitude. On the contrary, the third capacitor 212 with a larger capacitance serves to absorb ESD spikes of a larger magnitude induced upon backward bias of the LED 20.

Accordingly, the first resistor 211 and second resistor 221 are made of a material having a low dielectric constant, while the third capacitor 212 and the fourth capacitor 222 are made of a material having a high dielectric constant. The first diode 213 and the second diode 223 are constructed the two p-type substrates 231 and the n-type substrate 232 in the circuit substrate 23.

The first ESD protection configuration 21 and the ESD protection configuration 22 provided by the structures illustrated in FIGS. 4 and 5 serve as a two-way ESD protection configuration to effectively eliminate the damages caused by ESD carried by human bodies. Meanwhile, the simplified structures disclosed in FIGS. 1 and 3 may also serve to achieve equivalent objectives at a lower cost.

This invention is related to a novel creation that makes a breakthrough in the art. Aforementioned explanations, however, are directed to the description of preferred embodiments according to this invention. Since this invention is not limited to the specific details described in connection with the preferred embodiments, changes and implementations to certain features of the preferred embodiments without altering the overall basic function of the invention are contemplated within the scope of the appended claims.

What is claimed is:

1. An ESD protection configuration for light emitting diodes (LED), comprising:
    a resistor, having a first end connected to an n-node of an LED; and
    a capacitor, having a first end connected to a second end of the resistor and a second end connected to a p-node of the LED, wherein the LED, resistor and capacitor are mounted unto a circuit substrate, such that the resistor and the capacitor are disposed outside the circuit substrate and connected to the LED via the circuit substrate to form an RC circuit;
    whereby the RC circuit engaging a parallel connection with the LED is able to guard the LED against spikes, absorb and remove ESD and prevents the LED from burning to effectively extend the lifespan of the LED.

2. An ESD protection con Figuration for light emitting diodes (LED), comprising:
    a resistor, having a first end connected to an n-node of an LED; and
    an equivalent capacitor, equivalent to a capacitor having a first end connected to a second end of the resistor and a, second end connected to a p-node of the LED, wherein the LED, resistor and equivalent capacitor are mounted unto a circuit substrate, such that the resistor and the equivalent capacitor are disposed inside the circuit substrate and connected to an p-n junction of the LED via the circuit substrate to form an RC circuit;

whereby the RC circuit engaging a parallel connection with the LED is able to guard the LED against spikes, absorb and remove ESD and prevents the LED from burning to effectively extend the lifespan or the LED.

3. The ESD protection configuration for LED of claim 2, wherein the equivalent capacitor includes a first capacitor and a second capacitor that are connected in series and has an equivalent capacitance represented by the formula, $1/C=1/C_1 + 1/C_2$.

4. The ESD protection configuration for LED of claim 2, wherein the p-n junction of the LED and the p-n junction of the circuit substrate are provided with a metal conductive layer and an insulator.

5. The ESD protection configuration For LED of claim 1, wherein the capacitor is made of a material having a high dielectric constant greater than 3.9.

6. The ESD protection configuration For LED of claim 4, wherein the material having a high dielectric constant is selected from one of the group consisting of: $SiN_x$, $SiO_2$, $TiO_2$, TiN and $BaTiO_3$, or their series material with dielectric constant be higher than 3.98.

7. The ESD protection configuration for LED of claim 1, wherein the resistor has an ideal resistance of 1KΩ.

8. The ESD protection configuration for LED of claim 1, wherein the LED is a high speed semiconductor, such as Groups III–V nitride semiconductors containing InGaN.

9. An ESD protection configuration for LED, comprising:
an LED, having a p-n junction and connected to a circuit substrate, the circuit substrate having two p-type substrates and one n-type substrate therein;
a first ESD protection configuration, built-in the circuit substrate and including a first resistor, a first capacitor and a first diode that are connected in series and then engage a parallel connection with the LED, wherein the first diode has a p-node connected to an n-node of the LED; and
a second ESD protection con figuration, built-in the circuit substrate and including a second resistor, a second capacitor and a second diode that are connected in series and then engage a parallel connection with the LED and the first ESD protection configuration, wherein the second diode has a p-node connected to the p-node of the LED.

10. The ESD protection configuration For LED of claim 9, wherein the first capacitor has a first capacitance greater than a second capacitance of the second capacitor.

11. The ESD protection configuration for LED of claim 10, wherein the first capacitance ranges between 100pF and 100nF.

12. The ESD protection configuration for LED of claim 10, wherein the second capacitance ranges between 100pF and 100nF.

13. The ESD protection configuration for LED of claim 10, wherein the first capacitor includes a third capacitor and a fourth capacitor that are connected in series and has an equivalent capacitance represented by the formula, $1/(C_{first\ capacitor}) = 1/(C_{third\ capacitor}) + 1/(C_{fourth\ capacitor})$.

14. The ESD protection configuration for LED of claim 9, wherein the second capacitor includes a fifth capacitor and a sixth capacitor that are connected in series and has an equivalent capacitance represented by the formula, $1/(C_{second\ capacitor}) = 1/(C_{fifth\ capacitor}) + 1/(C_{sixth\ capacitor})$.

15. The ESD protection configuration for LED of claim 9, wherein the capacitor is made of a material having a high dielectric constant greater than 3.9.

16. The ESD protection configuration for LED of claim 15, wherein the material having a high dielectric constant is selected from one of the group consisting of: $SiN_x$, $SiO_2$, $TiO_2$, TiN and $BaTiO_3$.

17. The ESD protection configuration for LED of claim 9, wherein the first resistor and the second resistor are made of a material having a low dielectric constant.

18. The ESD protection configuration for LED of claim 9, wherein the first resistor and the second resistor each have an ideal resistance or 1KΩ.

19. The ESD protection configuration for LED of claim 9, wherein the first diode and the second diode are constructed the two p-type substrates and the n-type substrate in the circuit substrate.

20. The ESD protection configuration for LED of claim 9, wherein the LED is a high speed semiconductor, such as Groups III–V nitride semiconductors containing InGaN.

* * * * *